United States Patent
Huang

(10) Patent No.: US 11,309,266 B2
(45) Date of Patent: Apr. 19, 2022

(54) SEMICONDUCTOR DEVICE STRUCTURE WITH AIR GAP AND METHOD FOR FORMING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 112 days.

(21) Appl. No.: 16/885,939

(22) Filed: May 28, 2020

(65) Prior Publication Data

US 2021/0375803 A1 Dec. 2, 2021

(51) Int. Cl.
*H01L 23/00* (2006.01)
(52) U.S. Cl.
CPC .............. *H01L 24/05* (2013.01); *H01L 24/16* (2013.01); *H01L 2224/0225* (2013.01); *H01L 2224/02206* (2013.01); *H01L 2224/0401* (2013.01); *H01L 2224/16148* (2013.01)
(58) Field of Classification Search
CPC ...................... H01L 24/05; H01L 24/16; H01L 2224/02206; H01L 2224/0225; H01L 2224/0401; H01L 2224/16148
See application file for complete search history.

(56) References Cited

U.S. PATENT DOCUMENTS

| | | | | |
|---|---|---|---|---|
| 8,384,214 B2* | 2/2013 | Wu | ....................... | B81C 1/00801 257/734 |
| 9,991,244 B2* | 6/2018 | Lin | ......................... | H01L 24/89 |
| 2007/0152349 A1* | 7/2007 | Chung | ................ | H01L 25/0657 257/786 |
| 2009/0102059 A1* | 4/2009 | Ishii | ......................... | H01L 24/05 257/774 |
| 2009/0263951 A1* | 10/2009 | Shibata | ............. | H01L 21/76816 438/422 |
| 2012/0126408 A1* | 5/2012 | Ernur | ................... | H01L 21/7682 257/741 |

(Continued)

*Primary Examiner* — Mamadou L Diallo
(74) *Attorney, Agent, or Firm* — Muncy, Geissler, Olds & Lowe, P.C.

(57) ABSTRACT

The present disclosure discloses a semiconductor device structure with an air gap for reducing capacitive coupling and a method for forming the semiconductor device structure. The semiconductor device structure includes a first conductive pad over a first semiconductor substrate, and a first conductive structure over the first conductive pad. The semiconductor device structure also includes a second conductive structure over the first conductive structure, and a second conductive pad over the second conductive structure. The second conductive pad is electrically connected to the first conductive pad through the first and the second conductive structures. The semiconductor device structure further includes a second semiconductor substrate over the second conductive pad, a first passivation layer between the first and the second semiconductor substrates and covering the first conductive structure, and a second passivation layer between the first passivation layer and the second semiconductor substrate. The first and the second passivation layers surround the second conductive structure, and a first air gap is enclosed by the first and the second passivation layers.

19 Claims, 20 Drawing Sheets

(56) References Cited

U.S. PATENT DOCUMENTS

| | | | | |
|---|---|---|---|---|
| 2015/0364434 A1* | 12/2015 | Chen | ................... | H01L 24/06 |
| | | | | 257/773 |
| 2016/0093566 A1* | 3/2016 | Ting | ................... | H01L 23/5329 |
| | | | | 257/774 |
| 2016/0197049 A1* | 7/2016 | Chen | ................... | H01L 23/53295 |
| | | | | 438/107 |
| 2016/0197055 A1* | 7/2016 | Yu | ................... | H01L 24/81 |
| | | | | 257/737 |
| 2017/0154873 A1* | 6/2017 | Kim | ................... | H01L 24/02 |
| 2017/0373044 A1* | 12/2017 | Das | ................... | H01L 23/5226 |
| 2018/0261575 A1* | 9/2018 | Tagami | ................... | H01L 25/50 |
| 2019/0164937 A1* | 5/2019 | Lin | ................... | H01L 24/81 |
| 2021/0028135 A1* | 1/2021 | Said | ................... | H01L 24/05 |
| 2021/0028148 A1* | 1/2021 | Wu | ................... | H01L 24/80 |
| 2021/0066380 A1* | 3/2021 | Kawashima | ................... | H01L 23/53295 |
| 2021/0225787 A1* | 7/2021 | Wu | ................... | H01L 24/02 |
| 2021/0233849 A1* | 7/2021 | Greco | ................... | H01L 23/5227 |
| 2021/0305188 A1* | 9/2021 | Shin | ................... | H01L 23/3171 |

* cited by examiner

SEMICONDUCTOR DEVICE STRUCTURE WITH AIR GAP AND METHOD FOR FORMING THE SAME

TECHNICAL FIELD

The present disclosure relates to a semiconductor device structure and a method for forming the same, and more particularly, to a semiconductor device structure with an air gap for reducing capacitive coupling and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as increased parasitic capacitance between adjacent conductive elements, which results in increased power consumption and unwanted resistive-capacitive (RC) delay (i.e., signal delay). Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first conductive pad over a first semiconductor substrate, and a first conductive structure over the first conductive pad. The semiconductor device structure also includes a second conductive structure over the first conductive structure, and a second conductive pad over the second conductive structure. The second conductive pad is electrically connected to the first conductive pad through the first conductive structure and the second conductive structure. The semiconductor device structure further includes a second semiconductor substrate over the second conductive pad, and a first passivation layer between the first semiconductor substrate and the second semiconductor substrate and covering the first conductive structure. In addition, the semiconductor device structure includes a second passivation layer between the first passivation layer and the second semiconductor substrate. The first passivation layer and the second passivation layer surround the second conductive structure, and a first air gap is enclosed by the first passivation layer and the second passivation layer.

In an embodiment, the first passivation layer covers a top surface and a sidewall of the first conductive structure. In an embodiment, the semiconductor device structure further includes a third conductive structure adjacent to the first conductive structure, wherein the first air gap is between the first conductive structure and the third conductive structure. In an embodiment, the first passivation layer covers a top surface and a sidewall of the third conductive structure.

In an embodiment, the semiconductor device structure further includes a third passivation layer between the first passivation layer and the first semiconductor substrate, wherein the third passivation layer covers the first conductive pad and surrounds a lower portion of the first conductive structure. In an embodiment, the semiconductor device structure further includes a fourth passivation layer between the second passivation layer and the second semiconductor substrate, wherein the second conductive structure is surrounded by the first passivation layer, the second passivation layer, and the fourth passivation layer, and a second air gap is enclosed by the second passivation layer and the fourth passivation layer. In an embodiment, the first air gap has a concave top surface.

In another embodiment of the present disclosure, a semiconductor device structure is provided. The semiconductor device structure includes a first conductive pad over a first semiconductor substrate, and a first conductive structure over the first conductive pad. The semiconductor device structure also includes a first passivation layer covering the first conductive structure, and a second passivation layer covering the first passivation layer. A first air gap is enclosed by the first passivation layer and the second passivation layer, and a bottom surface of the first air gap is lower than a top surface of the first conductive structure. The semiconductor device structure further includes a second conductive structure penetrating through the first passivation layer and the second passivation layer to contact the first conductive structure, and a second conductive pad over the second conductive structure. The second conductive pad is electrically connected to the first conductive pad through the first conductive structure and the second conductive structure. In addition, the semiconductor device structure includes a second semiconductor substrate over the second conductive pad.

In an embodiment, the semiconductor device structure includes a third conductive structure adjacent to the first conductive structure, wherein the first passivation layer covers a sidewall of the first conductive structure and a sidewall of the third conductive structure such that the third conductive structure is separated from the first conductive structure by the first passivation layer and the first air gap. In an embodiment, the semiconductor device structure includes a third passivation layer between the first semiconductor substrate and the first passivation layer, wherein the third passivation layer covers the first conductive pad, and the first conductive structure penetrates through the third passivation layer to contact the first conductive pad.

In an embodiment, the first conductive structure extends onto the third passivation layer. In an embodiment, a topmost surface of the third passivation layer is higher than the bottom surface of the first air gap, In an embodiment, the semiconductor device structure further includes a fourth passivation layer between the second passivation layer and the second semiconductor substrate, wherein the second conductive structure penetrates through the fourth passivation layer, and a second air gap is enclosed by the second passivation layer and the fourth passivation layer, and wherein a portion of the second passivation layer between the first air gap and the second air gap has a curved shape.

In yet another embodiment of the present disclosure, a method for forming a semiconductor device structure is provided. The method includes forming a first semiconductor structure, and forming a second semiconductor structure. The method for forming the first semiconductor structure includes forming a first passivation layer to cover a first conductive structure over a first semiconductor substrate, and forming a first energy removable structure over the first passivation layer. The method for forming the second semiconductor structure includes forming a second conductive structure and a second passivation layer over a second semiconductor substrate. The second conductive structure protrudes from the second passivation layer. The method also includes bonding the second semiconductor structure to the first semiconductor structure with the second passivation layer facing the first passivation layer, and performing a heat treatment process to transform the first energy removable structure into a first air gap enclosed by the first passivation layer and the second passivation layer.

In an embodiment, a top surface of the first energy removable structure is substantially level with a top surface of the first passivation layer before bonding the second semiconductor structure to the first semiconductor structure. In an embodiment, the method for forming the first semiconductor structure further includes forming a third passivation layer covering a first conductive pad over the first semiconductor substrate, etching the third passivation layer to form an opening exposing the first conductive pad, and forming the first conductive structure and a third conductive structure over the third passivation layer, wherein the opening is filled by the first conductive structure. In an embodiment, the first passivation layer is formed to cover a sidewall of the first conductive structure and a sidewall of the third conductive structure, and the first conductive structure is separated from the third conductive structure by the first passivation layer and the first energy removable structure.

In an embodiment, the method for forming the first semiconductor structure further includes etching the first passivation layer to expose a top surface of the first conductive structure, and wherein the second conductive structure is bonded to the top surface of the first conductive structure after the second semiconductor structure is bonded to the first semiconductor structure. In an embodiment, the method for forming the second semiconductor structure further includes forming a fourth passivation layer covering a second conductive pad over the second semiconductor substrate, and forming a second energy removable structure over the fourth passivation layer before the second conductive structure and the second passivation layer are formed. In an embodiment, the second energy removable structure is enclosed by the fourth passivation layer and the second passivation layer before the second semiconductor structure is bonded to the first semiconductor structure, and wherein the second energy removable structure is transformed into a second air gap during the heat treatment process, and the second air gap has a concave bottom surface.

Embodiments of a semiconductor device structure are provided in the disclosure. The semiconductor device structure includes a first conductive structure and a second conductive structure between a first semiconductor substrate and a second semiconductor substrate. The semiconductor device structure also includes a first passivation layer covering the first conductive structure, and a second passivation layer over the first passivation layer. An air gap is enclosed by the first passivation layer and the second passivation layer. Therefore, the parasitic capacitance between the first conductive structure, the second conductive structure and adjacent conductive structures may be reduced. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
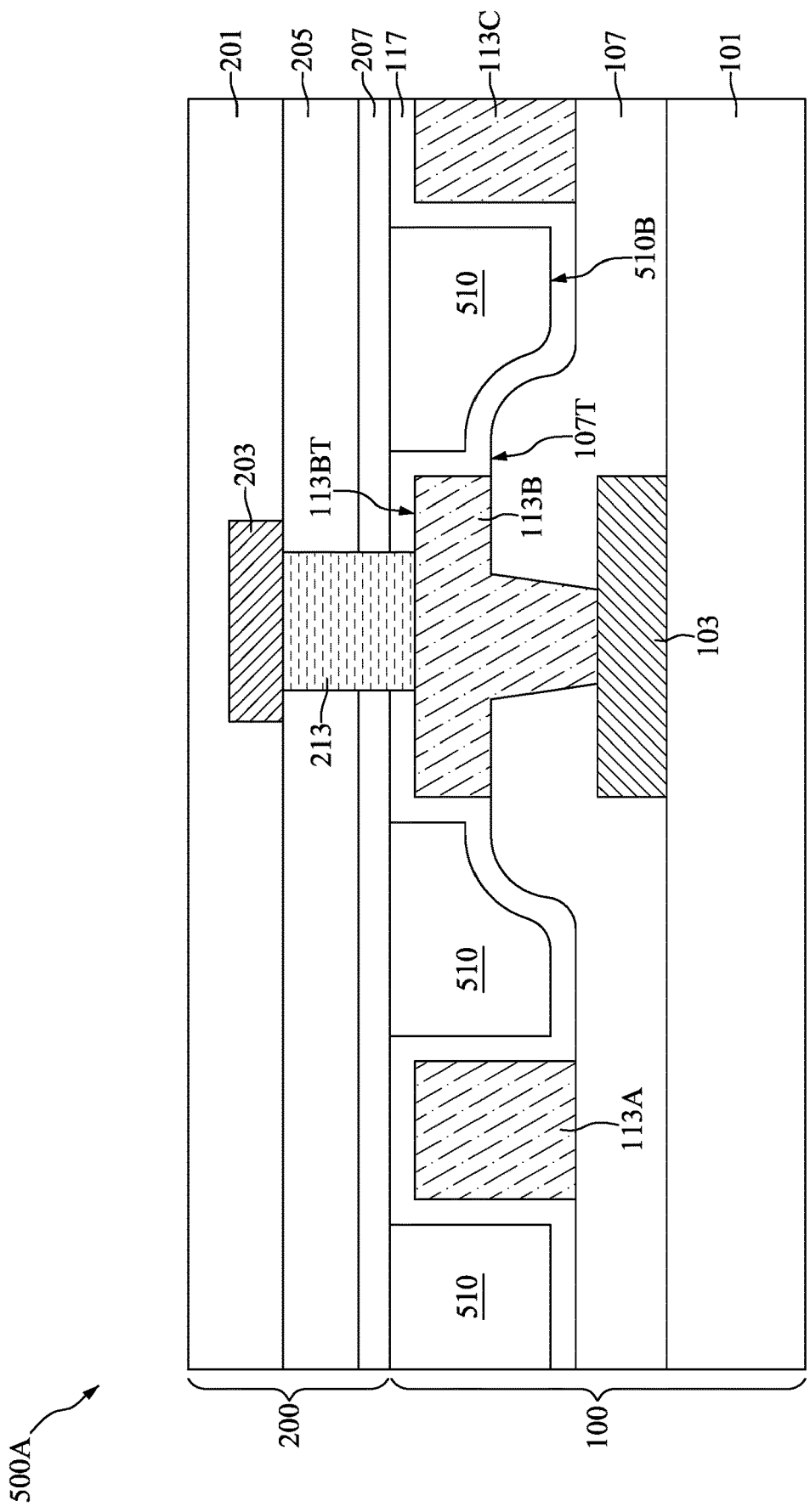
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 500A, in accordance with some embodiments. The semiconductor device structure 500A includes a first semiconductor structure 100, a second semiconductor structure 200 bonded on the first semiconductor structure 100, and air gaps 510 sealed (or enclosed) by the first semiconductor structure 100 and the second semiconductor structure 200, as shown in FIG. 1 in accordance with some embodiments.

In the first semiconductor structure 100, a conductive pad 103 is over the first semiconductor substrate 101, the conductive pad 103 is partially covered by a passivation layer 107, conductive structures 113A, 113B, and 113C are over the passivation layer 107, and the conductive structures 113A, 113B, and 113C are covered by a passivation layer 117, in accordance with some embodiments. In particular, the conductive structure 113B is between the conductive structures 113A and 113C, and the conductive structure 113B is over and in direct contact with the conductive pad 103. In some embodiments, a lower portion of the conductive structure 113B is surrounded by the passivation layer 107, and an upper portion of the conductive structure 113B extends onto the passivation layer 107.

Moreover, in the second semiconductor structure 200, a conductive structure 213 is bonded to the conductive structure 113B, and a passivation layer 207 is bonded to the passivation layer 117, in accordance with some embodiments. In some embodiments, a lower portion of the conductive structure 213 is surrounded by the passivation layers 117 and 207, and an upper portion of the conductive structure 205 is surrounded by a passivation layer 205, which is over the passivation layer 207. In addition, the second semiconductor structure 200 includes a conductive pad 203 over the conductive structure 213, and a second semiconductor substrate 201 over the conductive pad 203, in accordance with some embodiments.

In some embodiments, the conductive pad 103 of the first semiconductor structure 100 is electrically connected to the conductive pad 103 of the second semiconductor structure 200 through the conductive structure 113B and the conductive structure 213. In some embodiments, the conductive pad 103, the conductive structure 113B, the conductive structure 213, and the conductive pad 203 are stacked together.

It should be noted that air gaps 510 are enclosed by the passivation layer 117 of the first semiconductor structure 100 and the passivation layer 207 of the second semiconductor structure 200. Specifically, the conductive structure 113B is separated from the conductive structures 113A and 113C by the passivation layer 117 and the air gaps 510. In some embodiments, the bottom surface 510B of the air gaps 510 is lower than the top surface 113BT of the conductive structure 113B. In some embodiments, the bottom surface 510B of the air gaps 510 is lower than the topmost surface 107T of the passivation layer 107.

Although three air gaps 510 are shown in the cross-sectional view of FIG. 1, the three air gaps 510 may be connected to each other in different cross-sectional views. Furthermore, the number of the conductive pad 103, the number of the conductive structures 113A, 113B, and 113C, the number of the conductive structure 213, and the number of the conductive pads 203 may be adjusted depending on design requirements of the semiconductor device structure 500A.

Figure 2:
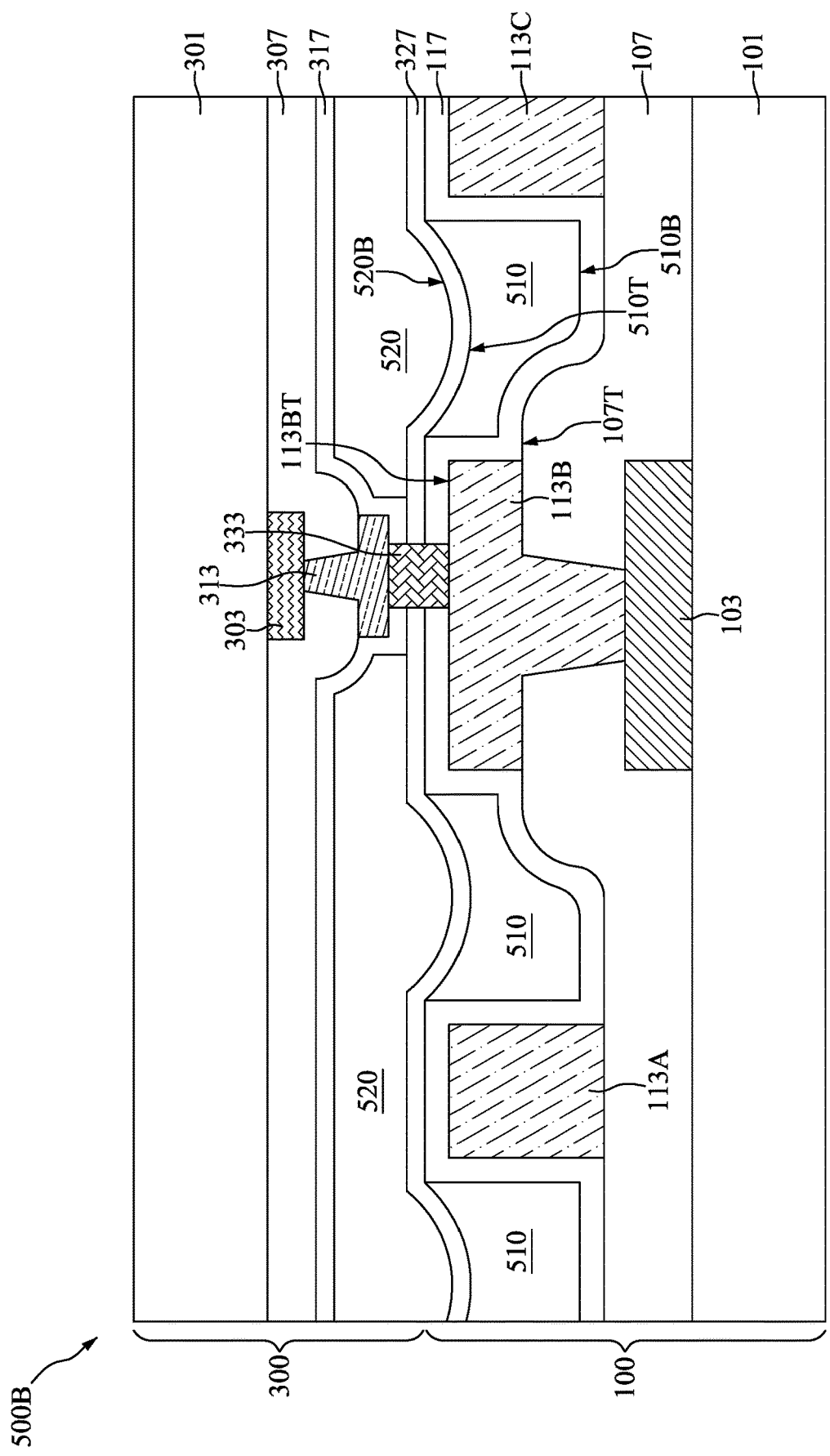
FIG. 2 is a cross-sectional view illustrating a modified semiconductor device structure, in accordance with some embodiments.

FIG. 2 is a cross-sectional view illustrating a modified semiconductor device structure 500B, which is an alternative embodiment of the semiconductor device structure 500A, in accordance with some embodiments. For reasons of consistency and clarity, similar components appearing in both FIGS. 1 and 2 will be labeled the same.

One major difference between the embodiment shown in FIG. 1 and the embodiment shown in FIG. 2 is that the second semiconductor structure 200 is replaced by a second semiconductor structure 300. As shown in FIG. 2, in the second semiconductor structure 300, a conductive structure 333 is bonded to the conductive structure 113B, a passivation layer 327 is bonded to the passivation layer 117, and a passivation layer 317 is over the passivation layer 327, in accordance with some embodiments. In some embodiments, the conductive structure 333 is surrounded by the passivation layers 117, 327, and 317.

Moreover, the second semiconductor structure 300 includes a conductive structure 313 over the conductive structure 333, and a passivation layer 307 over the passivation layer 317, in accordance with some embodiments. In some embodiments, a lower portion of the conductive structure 313 is surrounded by the passivation layer 317, and an upper portion of the conductive structure 313 is surrounded by the passivation layer 307. In addition, the second semiconductor structure 300 includes a conductive pad 303 over the conductive structure 313, and a second semiconductor substrate 301 over the conductive pad 303 and the passivation layer 307, in accordance with some embodiments.

In some embodiments, the conductive pad 103 of the first semiconductor structure 100 is electrically connected to the conductive pad 303 of the second semiconductor structure 300 through the conductive structure 113B, the conductive structure 333, and the conductive structure 313. In some embodiments, the conductive pad 103, the conductive structure 113B, the conductive structure 313, the conductive structure 333, and the conductive pad 303 are stacked together.

It should be noted that air gaps 520 are enclosed by the passivation layers 317 and 327 of the second semiconductor structure 300. The air gaps 520 are located over the air gaps 510. Specifically, each of the portions of the passivation layer 327 sandwiched between the (upper) air gaps 520 and the (lower) air gaps 510 has a curved shape due to gravity. In some embodiments, the curved shape is concave upward. In other words, each of the (lower) air gaps 510 has a concave top surface 510T, and each of the (upper) air gaps 520 has a concave bottom surface 520B. In addition, similar to the semiconductor device structure 500A, the bottom surface 510B of the air gaps 510 is lower than the top surface 113BT of the conductive structure 113B, in accordance with some embodiments. Furthermore, in some embodiments, the bottom surface 510B of the air gaps 510 is lower than the topmost surface 107T of the passivation layer 107.

Although two air gaps 520 are shown in the cross-sectional view of FIG. 2, the two air gaps 520 may be connected to each other in different cross-sectional views. Furthermore, the number of the conductive structure 333, the number of the conductive structure 313, and the number of the conductive pads 303 may be adjusted depending on design requirements of the semiconductor device structure 500B.

Figure 3:
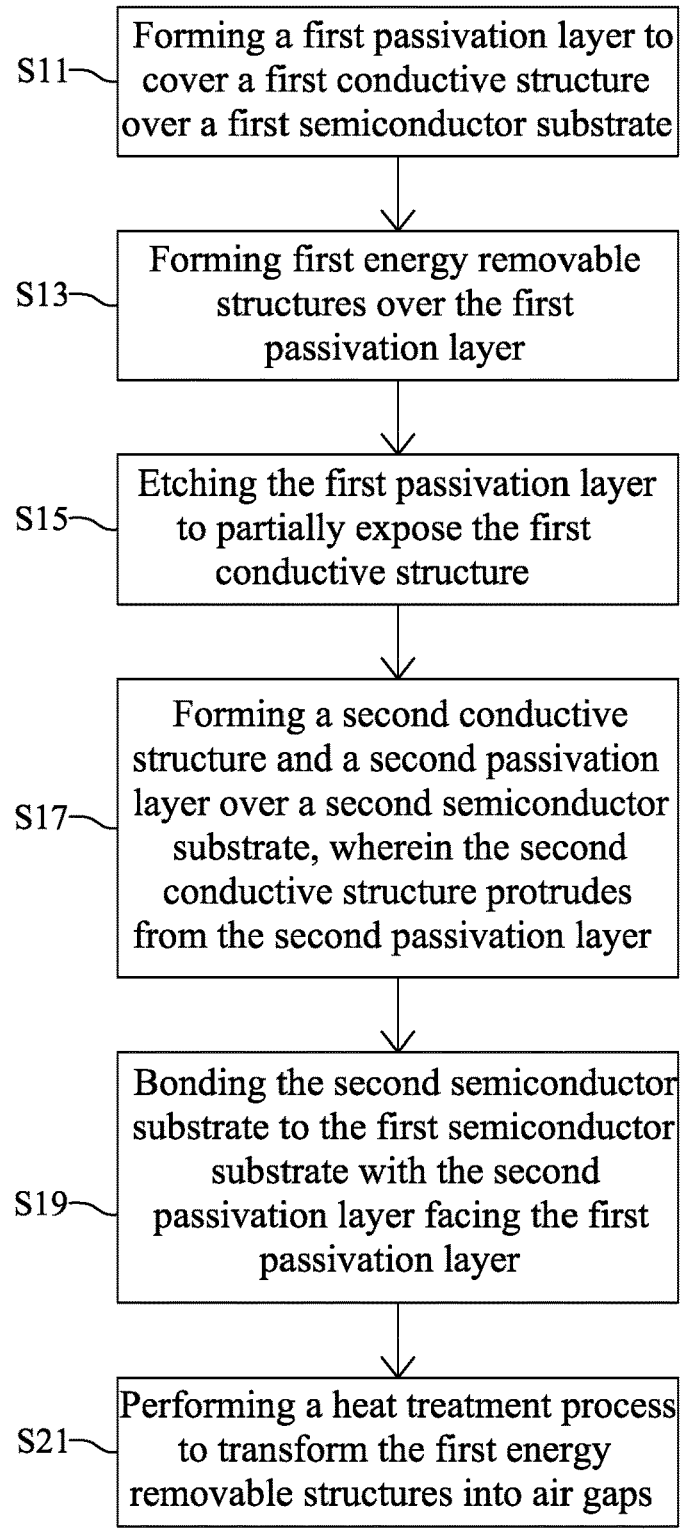
FIG. 3 is a flow diagram illustrating a method for forming a semiconductor device structure, in accordance with some embodiments.
Figure 4:
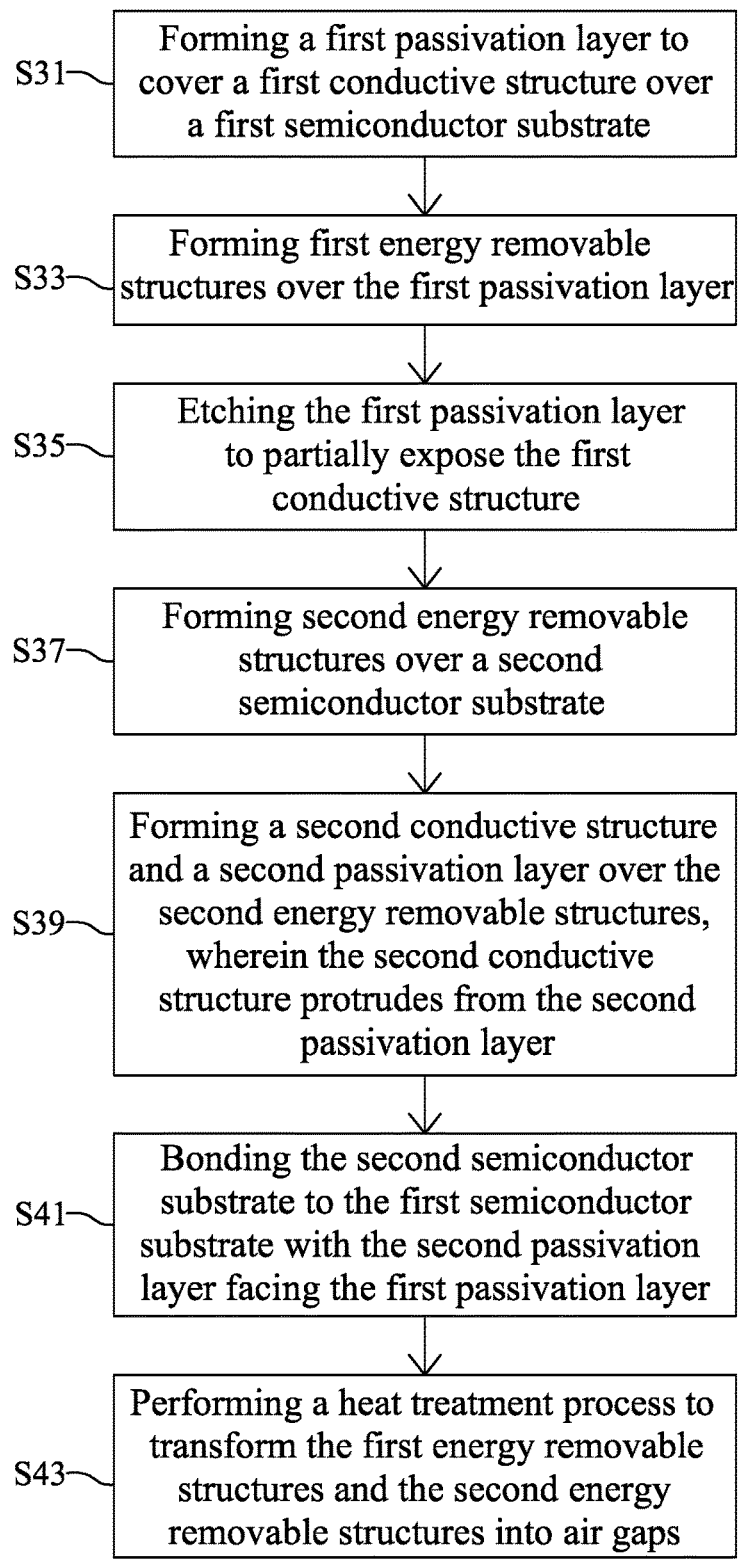
FIG. 4 is a flow diagram illustrating a method for forming a modified semiconductor device structure, in accordance with some other embodiments.

FIG. 3 is a flow diagram illustrating a method 10A for forming the semiconductor device structure 500A, and the method 10A includes steps S11, S13, S15, S17, S19, and S21, in accordance with some embodiments. FIG. 4 is a flow diagram illustrating another method 10B for forming the semiconductor device structure 500B, and the method 10B includes steps S31, S33, S35, S37, S39, S41, and S43, in accordance with some other embodiments. The steps S11 to S21 of FIG. 3 and the steps S31 to S43 of FIG. 4 are elaborated in connection with following figures.

Figure 5:
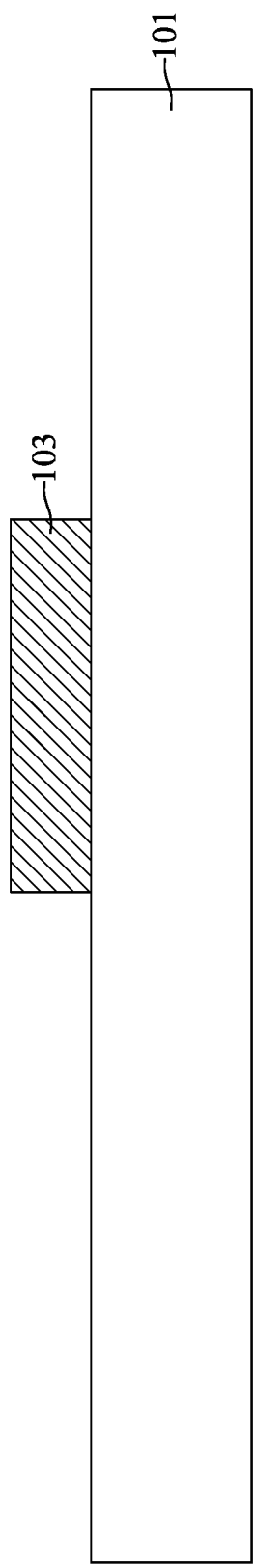
FIG. 5 is a cross-sectional view illustrating an intermediate stage of providing a first semiconductor substrate with a conductive pad during the formation of the semiconductor device structure, in accordance with some embodiments.

As shown in FIG. 5, the first semiconductor substrate 101 is provided. The first semiconductor substrate 101 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the first semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The first semiconductor substrate 101 has been simplified for the sake of clarity. It should be noted that additional features can be added in the first semiconductor substrate 101, and some of the features described below can be replaced, modified, or eliminated in other embodiments.

Still referring to FIG. 5, the conductive pad 103 is over the first semiconductor substrate 101. It should be noted that the conductive pad 103 is used to electrically connect the passive and/or active microelectronic devices in the first semiconductor substrate 101 to external devices.

Figure 6:
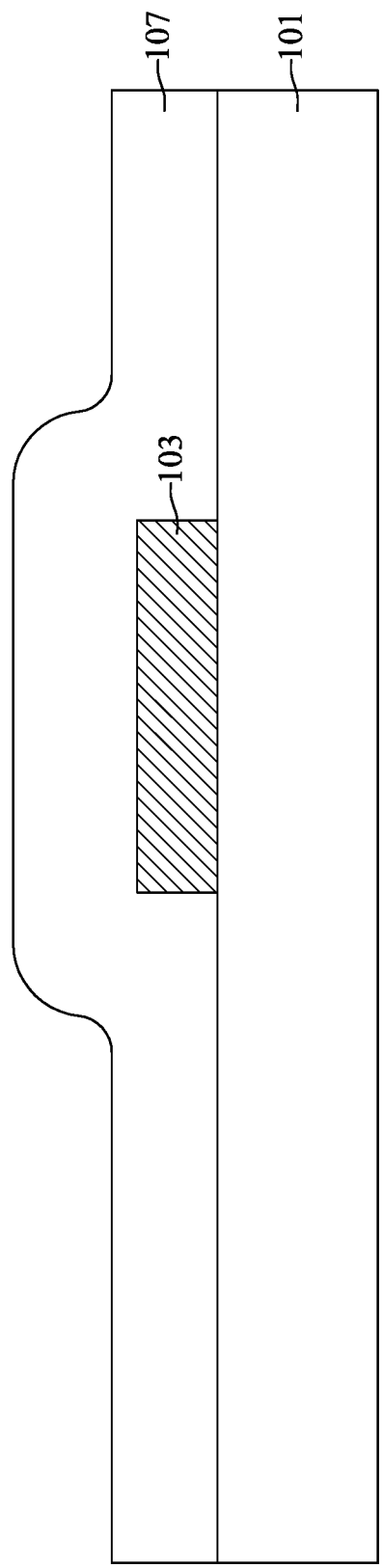
FIG. 6 is a cross-sectional view illustrating an intermediate stage of forming a passivation layer to cover the conductive pad during the formation of the semiconductor device structure, in accordance with some embodiments.

Next, the passivation layer 107 is formed to cover the conductive pad 103, as shown in FIG. 6 in accordance with some embodiments. In some embodiments, the passivation layer 107 is conformally deposited over the first semiconductor substrate 101 and the conductive pad 103. In some embodiments, the passivation layer 107 is made of silicon oxide, silicon carbide, silicon nitride, silicon oxynitride, another applicable material, or a combination thereof, and is formed by a chemical vapor deposition (CVD) process, a physical vapor deposition (PVD) process, an atomic layer deposition (ALD) process, a spin-coating process, or another applicable process.

Figure 7:
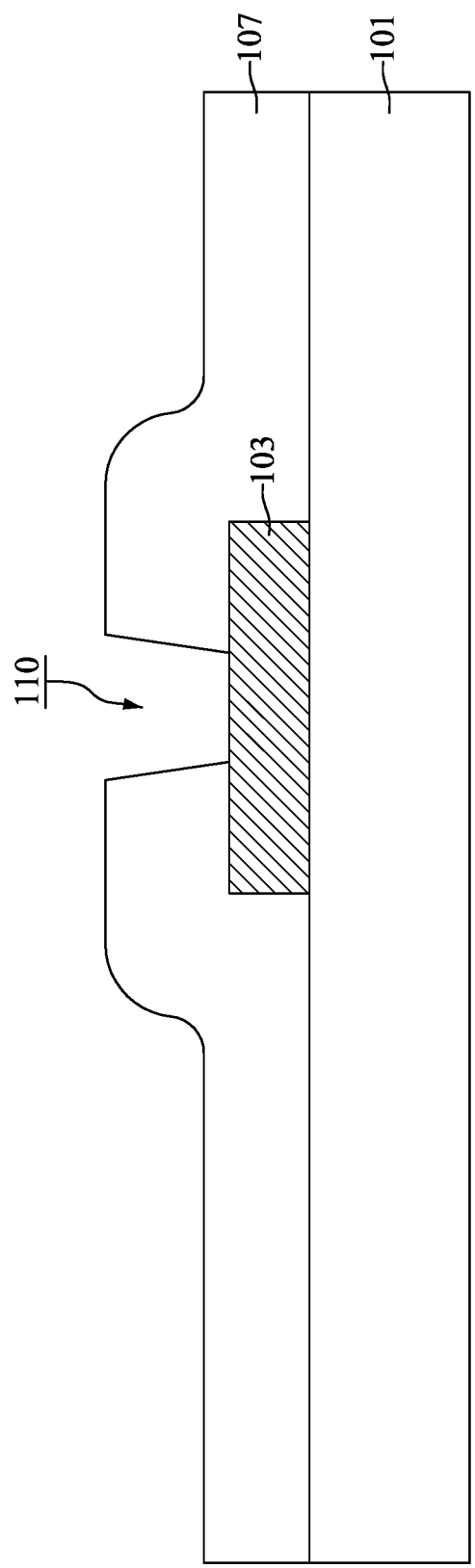
FIG. 7 is a cross-sectional view illustrating an intermediate stage of etching the passivation layer to expose the conductive pad during the formation of the semiconductor device structure, in accordance with some embodiments.

The passivation layer 107 is etched to form an opening 110, and the conductive pad 103 is partially exposed by the opening 110, as shown in FIG. 7 in accordance with some embodiments. For example, a mask (not shown) is formed over the passivation layer 107, and an etching process is performed to transfer the pattern of the mask onto the passivation layer 107. The mask may be formed by a deposition process and a patterning process. The deposition process may be a CVD process, a high-density plasma CVD (HDPCVD) process, a spin-coating process, or another applicable process. The patterning process may include a photolithography process and an etching process. The photolithography process may include photoresist coating (e.g., spin-coating), soft baking, mask aligning, exposure, post-exposure baking, developing the photoresist, rinsing and drying (e.g., hard baking). The etching process may include a dry etching process, a wet etching process, or a combination thereof.

Figure 8:
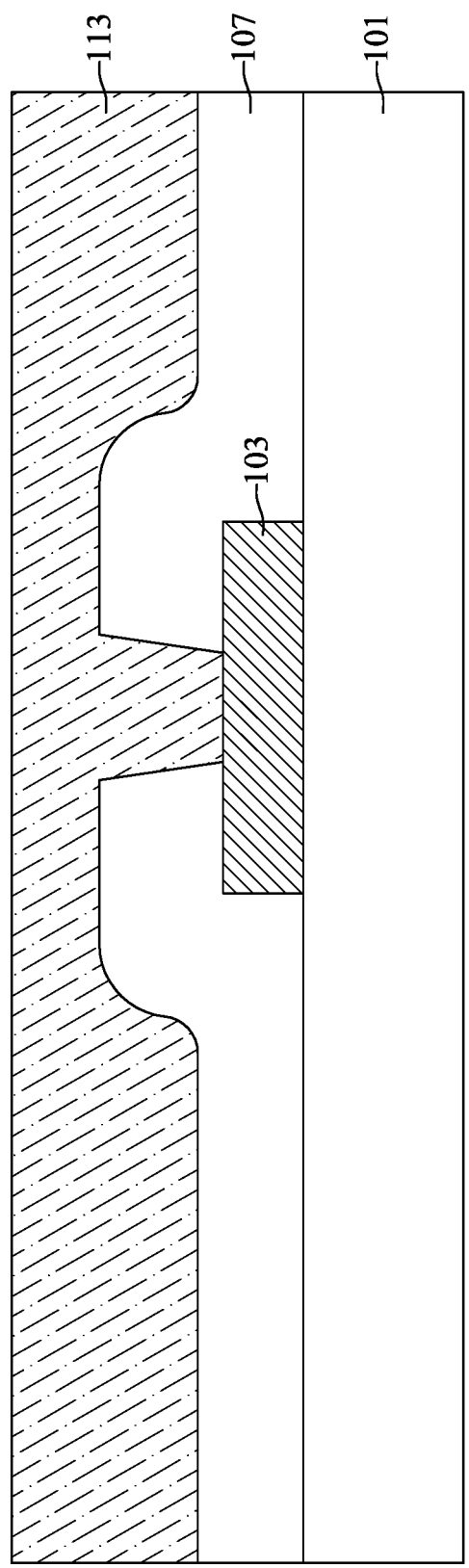
FIG. 8 is a cross-sectional view illustrating an intermediate stage of forming a conductive material during the formation of the semiconductor device structure, in accordance with some other embodiments.

After the opening 110 is formed, a conductive material 113 is formed over the passivation layer 107, as shown in FIG. 8 in accordance with some embodiments. In particular, the opening 110 is filled by the conductive material 113. In some embodiments, the conductive material 113 is made of copper (Cu), copper alloy, aluminum (Al), aluminum alloy, tungsten (W), tungsten alloy, titanium (Ti), titanium alloy, tantalum (Ta), tantalum alloy, another applicable conductive material, or a combination thereof, and is formed by a CVD process, a metal organic CVD (MOCVD) process, a PVD process, an ALD process, an electroplating process, a sputtering process, or another applicable process.

Figure 9:
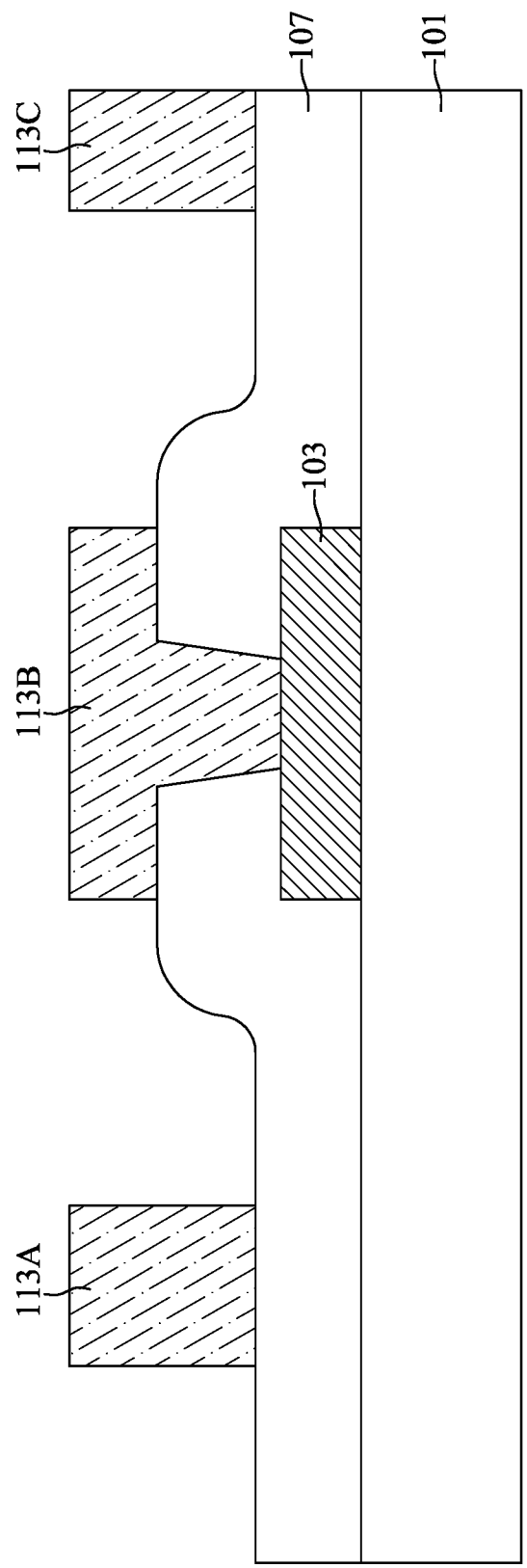
FIG. 9 is a cross-sectional view illustrating an intermediate stage of forming conductive structures during the formation of the semiconductor device structure, in accordance with some embodiments.

Then, the conductive material 113 is etched to form the conductive structures 113A, 113B, and 113C, as shown in FIG. 9 in accordance with some embodiments. For example, a mask (not shown) is formed over the conductive material 113, and an etching process is performed to transfer the pattern of the mask onto the conductive material 113. Some processes for forming the mask to etch the conductive material 113 are similar to, or the same as the processes for forming the mask to etch the passivation layer 107, and details thereof are not repeated herein. The etching process may include a dry etching process, a wet etching process, or a combination thereof.

In some embodiments, the conductive structure 113B between the conductive structures 113A and 113C is electrically connected to the conductive pad 103. More specifically, the conductive structure 113B has a T-shape, the lower portion of the conductive structure 113B penetrates through the passivation layer 107, and the upper portion of the conductive structure 113B protrudes from the passivation layer 107. In addition, the conductive structures 113A and 113C are entirely over the passivation layer 107.

Figure 10:
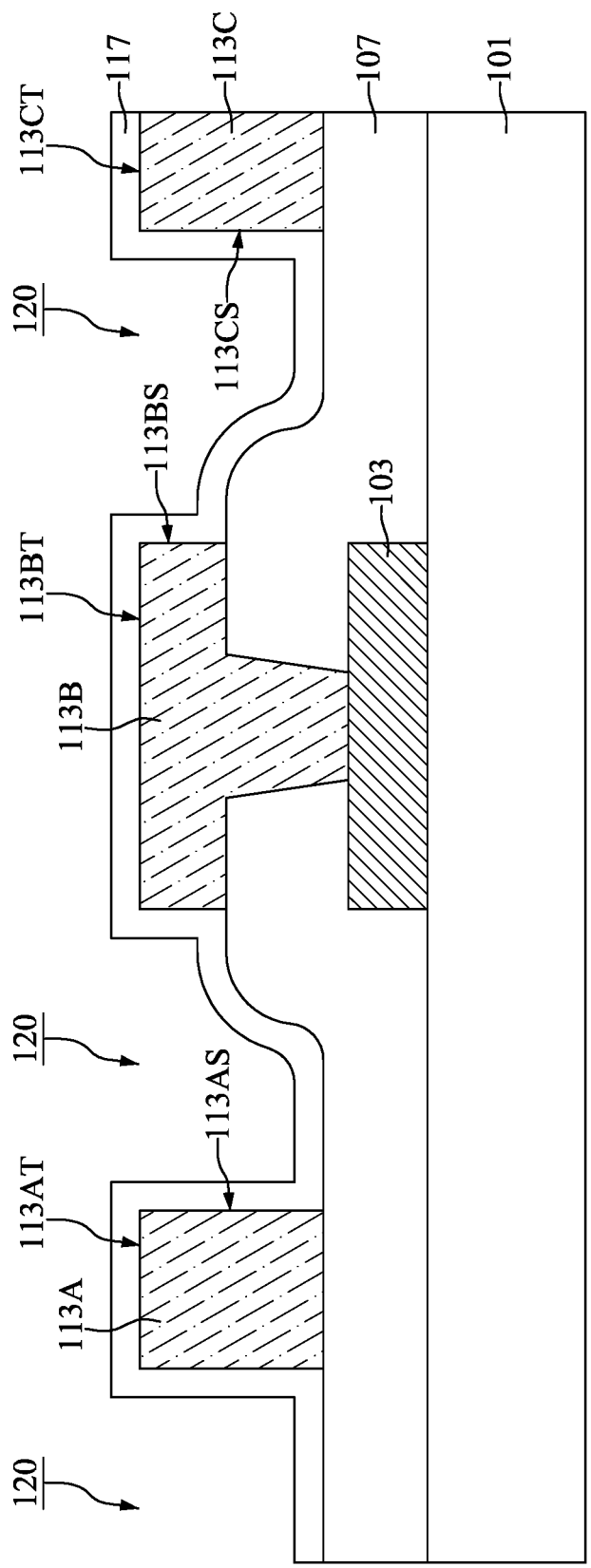
FIG. 10 is a cross-sectional view illustrating an intermediate stage of forming a passivation layer to cover the conductive structures during the formation of the semiconductor device structure, in accordance with some embodiments.

Subsequently, the passivation layer 117 is formed to cover the conductive structures 113A, 113B, and 113C, as shown in FIG. 10 in accordance with some embodiments. The respective step is illustrated as the step S11 in the method 10A shown in FIG. 3 and the step S31 in the method 10B shown in FIG. 4. In some embodiments, the passivation layer 117 is conformally deposited over the passivation layer 107 and the conductive structures 113A, 113B, and 113C, and openings 120 between the conductive structures 113A, 113B, and 113C are obtained over the passivation layer 117.

In particular, the top surface 113AT and the sidewalls 113AS of the conductive structure 113A, the top surface 113BT and the sidewalls 113BS, and the top surface 113CT and the sidewalls 113CS are covered by the passivation layer 117. Some materials and processes used to form the passivation layer 117 are similar to, or the same as, those used to form the passivation layer 107, and details thereof are not repeated herein.

Figure 11:
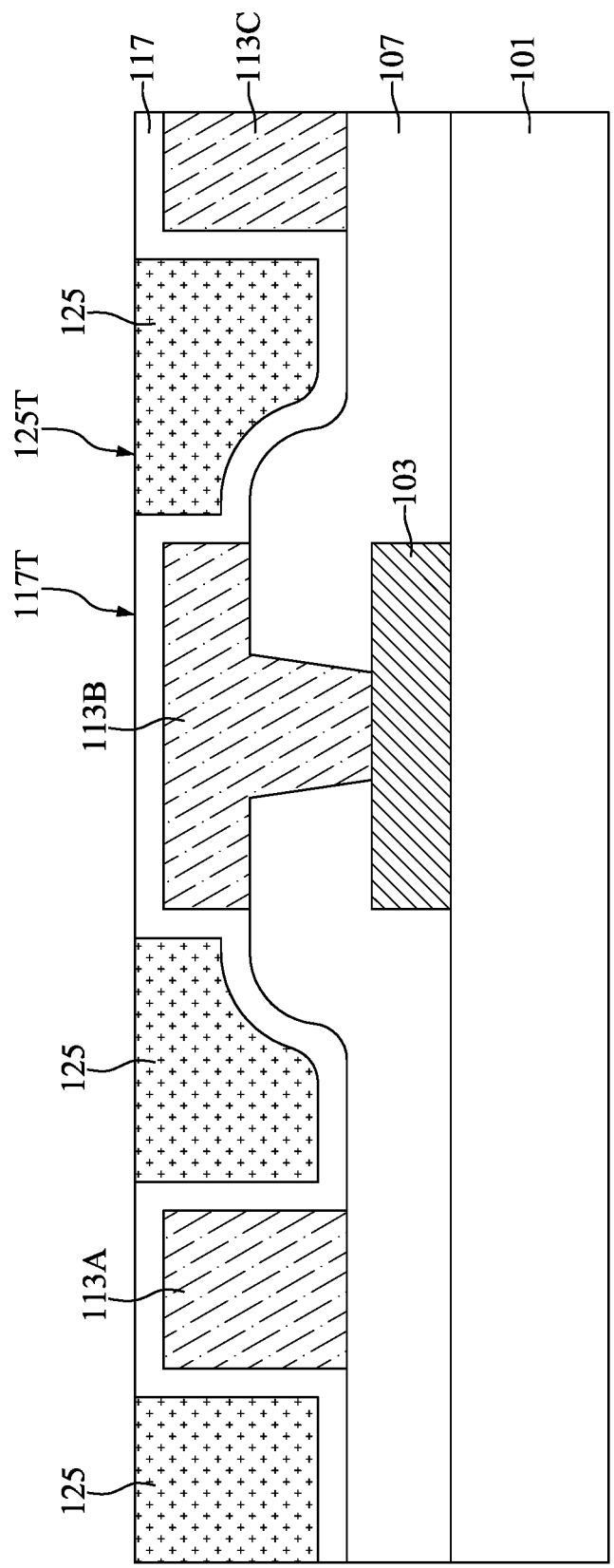
FIG. 11 is a cross-sectional view illustrating an intermediate stage of forming energy removable structures during the formation of the semiconductor device structure, in accordance with some embodiments.

After the passivation layer 117 is formed, energy removable structures 125 are formed in the openings 120 over the passivation layer 117, as shown in FIG. 11 in accordance with some embodiments. The respective step is illustrated as the step S13 in the method 10A shown in FIG. 3 and the step S33 in the method 10B shown in FIG. 4. In some embodiments, the materials of the energy removable structures 125 include a thermal decomposable material. In some other embodiments, the materials of the energy removable structures 125 include a photonic decomposable material, an e-beam decomposable material, or another applicable energy decomposable material.

Specifically, in some embodiments, the materials of the energy removable structures 125 include a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy removable structures 125 in the subsequent processes.

The energy removable structures 125 may be formed by a deposition process and a planarization process. For example, an energy removable material (not shown) is deposited to cover the entire passivation layer 117, and a planarization process is performed on the energy removable material to expose the top surface 117T of the passivation layer 117 over the conductive structures 113A, 113B, and 113C. The deposition process may include a CVD process, a PVD process, an ALD process, a spin-coating process, or another applicable process. The planarization process may be a chemical mechanical polishing (CMP) process.

In some embodiments, the top surfaces 125T of the energy removable structures 125 are substantially level with the top surface 117T of the passivation layer 117 after the planarization process. Within the context of this disclosure, the word "substantially" means preferably at least 90%, more preferably 95%, even more preferably 98%, and most preferably 99%. Although three energy removable structures 125 are shown in the cross-sectional view of FIG. 11, the three energy removable structures 125 may be connected to each other in different cross-sectional views.

Figure 12:
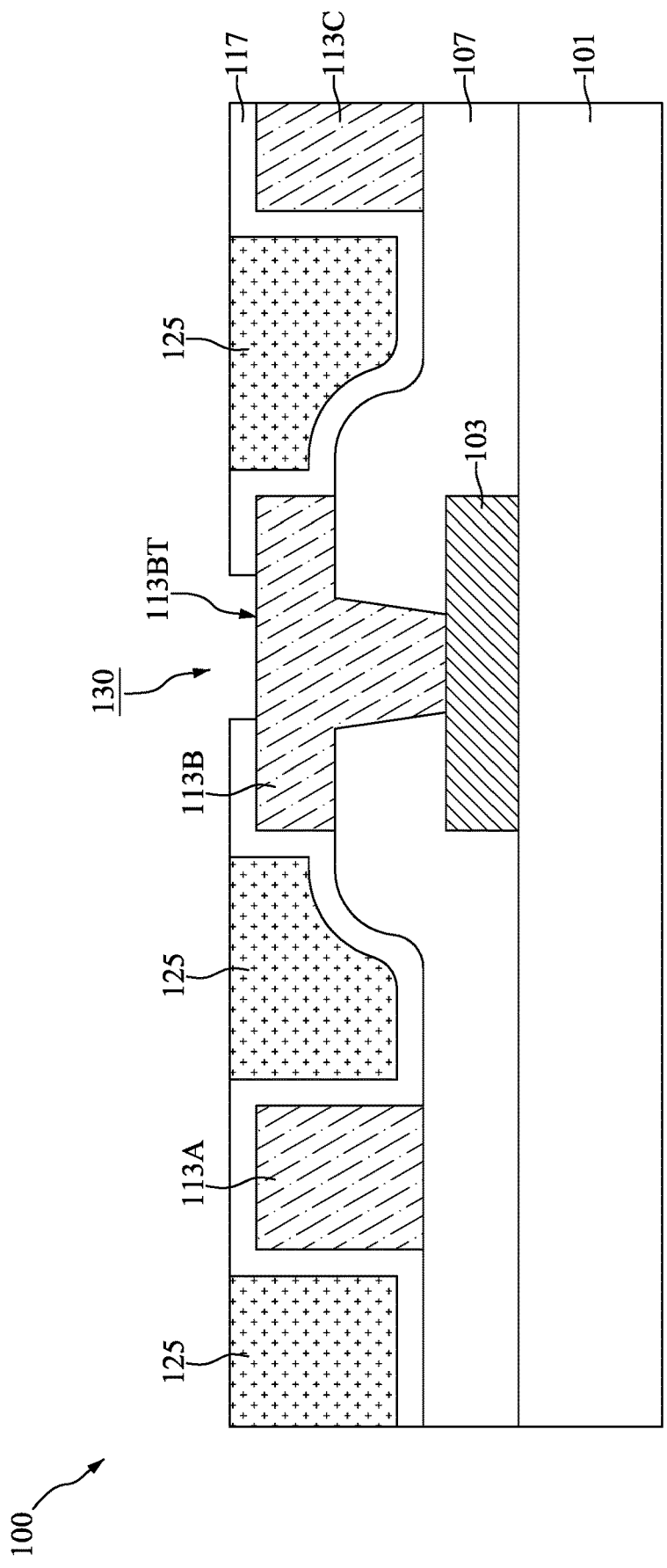
FIG. 12 is a cross-sectional view illustrating an intermediate stage of etching the passivation layer over the conductive structures during the formation of the semiconductor device structure, in accordance with some embodiments.

Then, the passivation layer 117 is etched to form an opening 130 partially exposing the conductive structure 113B, as shown in FIG. 12 in accordance with some embodiments. The respective step is illustrated as the step S15 in the method 10A shown in FIG. 3 and the step S35 in the method 10B shown in FIG. 4. In some embodiments, the top surface 113BT of the conductive structure 113B is partially exposed by the opening 130.

For example, a mask (not shown) is formed over the energy removable structures 125 and the passivation layer 117, and an etching process is performed to transfer the pattern of the mask onto the portion of the passivation layer 117 over the conductive structure 113B. Some processes for forming the mask to etch the passivation layer 117 are similar to, or the same as the processes for forming the mask to etch the passivation layer 107, and details thereof are not repeated herein. Moreover, the etching process may include a dry etching process, a wet etching process, or a combination thereof. After the opening 130 is formed, the first semiconductor structure 100 is obtained.

Figure 13:
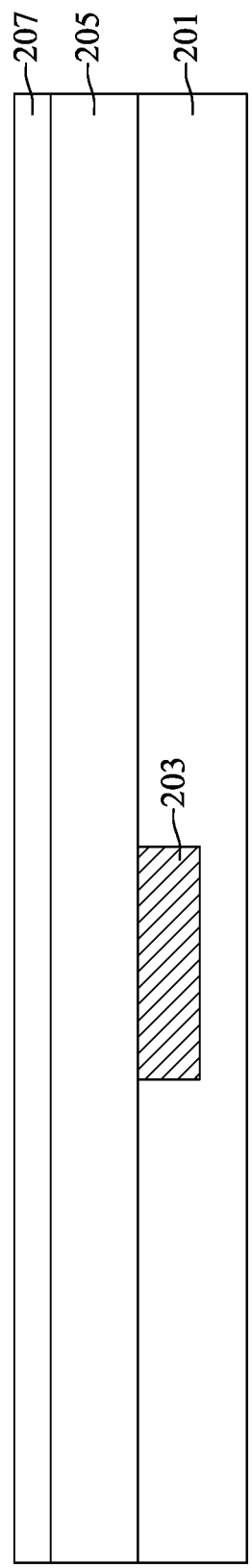
FIG. 13 is a cross-sectional view illustrating an intermediate stage of forming a passivation layer over a second semiconductor substrate during the formation of the semiconductor device structure, in accordance with some embodiments.

As shown in FIG. 13, the second semiconductor substrate 201 is provided. The second semiconductor substrate 201 may be a portion of an IC chip that includes various passive and active microelectronic devices. The examples of the devices in the second semiconductor substrate 201 are similar to, or the same as the devices in the first semiconductor substrate 101, and details thereof are not repeated herein. In some embodiments, the conductive pad 203 is over the second semiconductor substrate 201. Specifically, the conductive pad 203 is in the second semiconductor substrate 201 and exposed by a surface of the second semiconductor substrate 201. It should be noted that the conductive pad 203 is used to electrically connect the passive and/or active microelectronic devices in the second semiconductor substrate 201 to external devices.

Still referring to FIG. 13, the passivation layer 205 is formed over the second semiconductor substrate 201, and the passivation layer 207 is formed over the passivation layer 205. Some materials and processes used to form the passivation layers 205 and 207 are similar to, or the same as, those used to form the passivation layer 107 of the first semiconductor structure 100, and details thereof are not repeated herein. In some embodiments, the conductive pad 203 is covered by the passivation layer 205.

Figure 14:
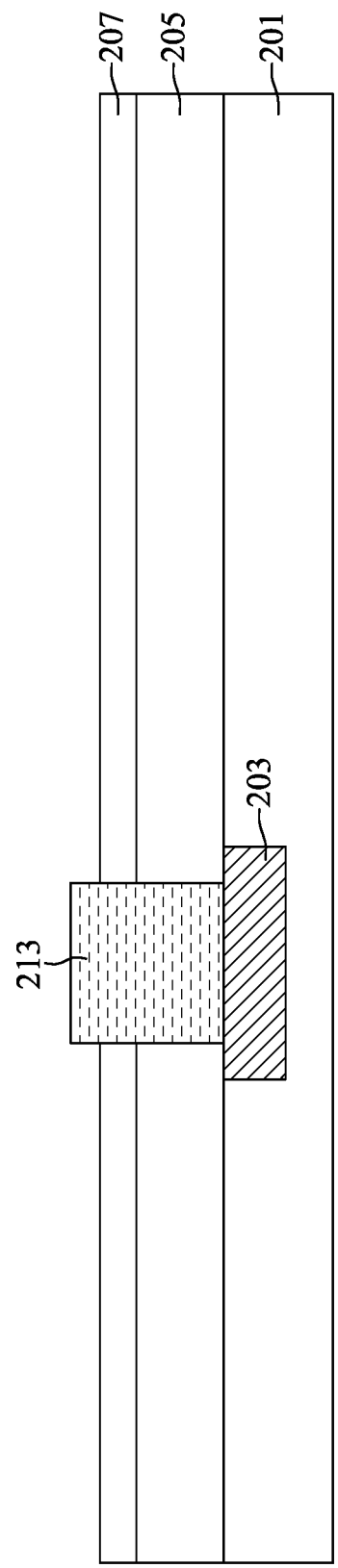
FIG. 14 is a cross-sectional view illustrating an intermediate stage of forming a conductive structure penetrating from the passivation layer over the second semiconductor substrate during the formation of the semiconductor device structure, in accordance with some embodiments.

Next, the conductive structure 213 is formed over the conductive pad 203, and the conductive structure 213 protrudes from the passivation layer 207, as shown in FIG. 14 in accordance with some embodiments. The respective step is illustrated as the step S17 in the method 10A shown in FIG. 3. In some embodiments, the conductive structure 213 penetrates through the passivation layers 205 and 207 to contact the conductive pad 203.

Some materials and processes used to form the conductive structure 213 are similar to, or the same as the materials and processes used to form the conductive structure 113B, and details thereof are not repeated herein. For example, a mask (not shown) is formed over the passivation layer 207, and an etching process is performed to transfer the pattern of the mask onto the passivation layers 207 and 205, such that an opening (not shown) is formed to partially expose the conductive pad 203. Then, a conductive material (not shown) is formed over the passivation layer 207 and filled into the opening. Another mask (not shown) is formed over the conductive material, and another etching process is performed on the conductive material to form the conductive structure 213. After the conductive structure 213 is formed, the second semiconductor structure 200 is obtained.

Figure 15:
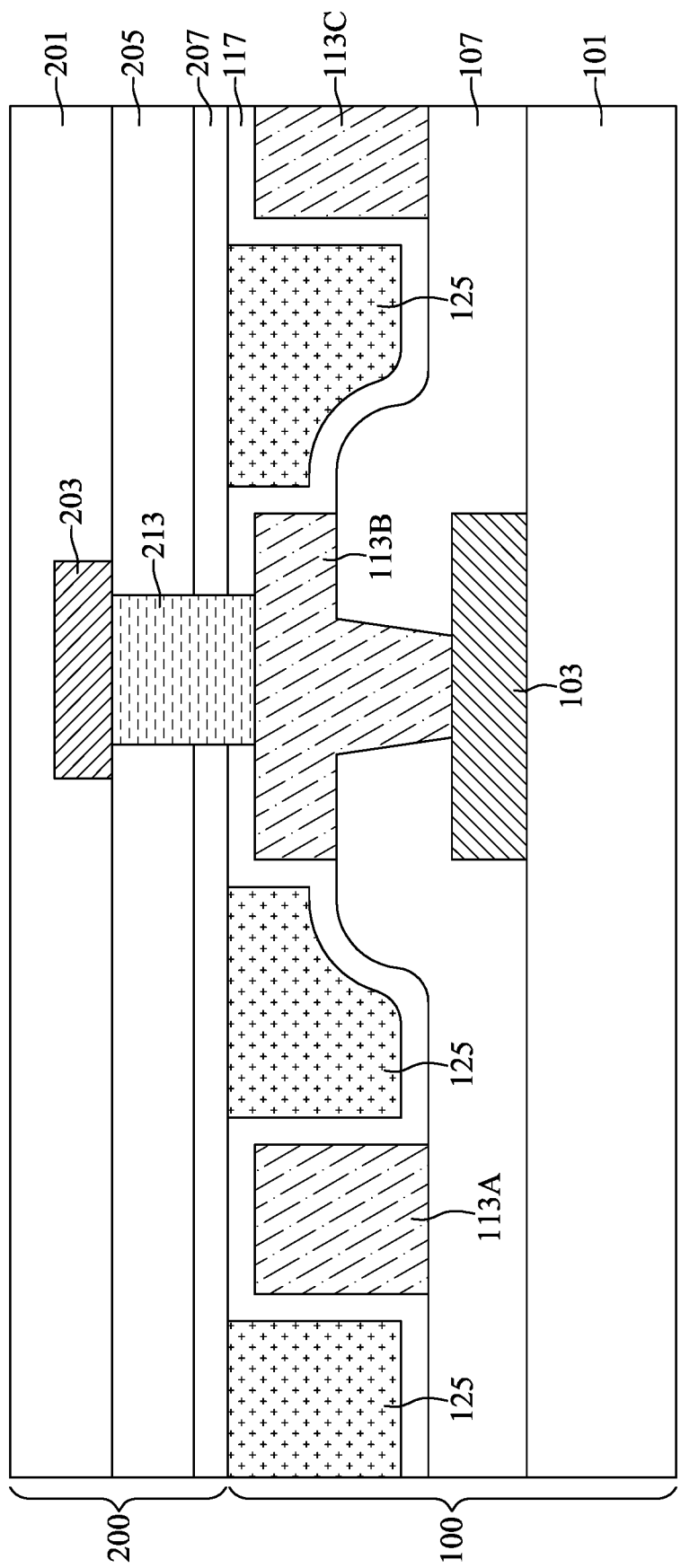
FIG. 15 is a cross-sectional view illustrating an intermediate stage of bonding the first semiconductor substrate to the second semiconductor substrate during the formation of the semiconductor device structure, in accordance with some embodiments.

Subsequently, the second semiconductor structure 200 is flipped upside down and bonded to the first semiconductor structure 100 with the passivation layer 207 facing the passivation layer 117, as shown in FIG. 15 in accordance with some embodiments. The respective step is illustrated as the step S19 in the method 10A shown in FIG. 3. After the bonding process, the energy removable structures 125 are enclosed by the passivation layers 117 and 207.

Referring back to FIG. 1, a heat treatment process is performed on the structure of FIG. 15 to transform the energy removable structures 125 into the air gaps 510. The respective step is illustrated as the step S21 in the method 10A shown in FIG. 3. In some embodiments, during the heat treatment process, the energy removable structures 125 are removed, such that the air gaps 510 are formed between the conductive structures 113A, 113B, and 113C, and the semiconductor device structure 500A is obtained.

More specifically, the heat treatment process is used to remove the decomposable porogen materials of the energy removable structures 125 to generate pores, and the pores are filled by air after the decomposable porogen materials are removed, such that the air gaps 510 are obtained, in accordance with some embodiments. In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable structures 125, such that the air gaps 510 are obtained.

Figure 16:
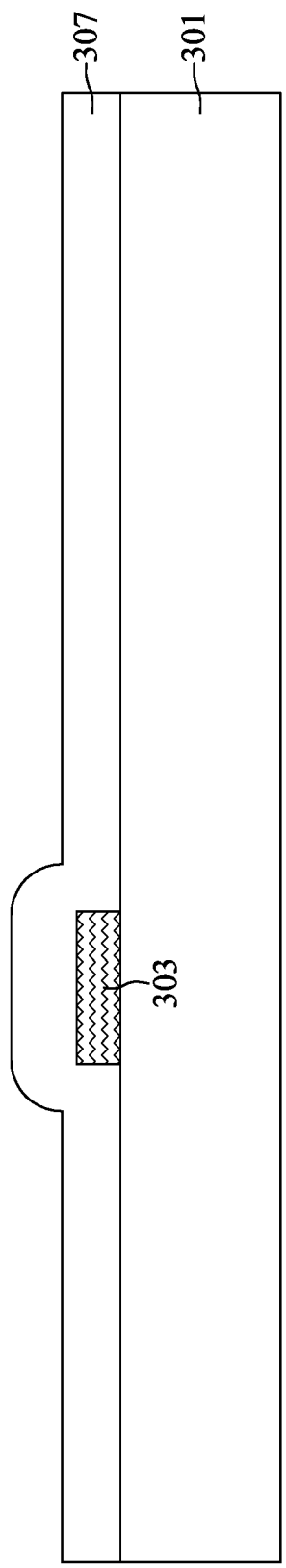
FIG. 16 is a cross-sectional view illustrating an intermediate stage of forming a passivation layer over a second semiconductor substrate during the formation of the modified semiconductor device structure, in accordance with some embodiments.

As shown in FIG. 16, the second semiconductor substrate 301 is provided. The second semiconductor substrate 301 may be a portion of an IC chip that includes various passive and active microelectronic devices. The examples of the devices in the second semiconductor substrate 301 are similar to, or the same as the devices in the first semiconductor substrate 101, and details thereof are not repeated herein. In some embodiments, the conductive pad 303 is over the second semiconductor substrate 301. It should be noted that the conductive pad 303 is used to electrically connect the passive and/or active microelectronic devices in the second semiconductor substrate 301 to external devices.

Still referring to FIG. 16, the passivation layer 307 is formed over the second semiconductor substrate 301. Some materials and processes used to form the passivation layer 307 are similar to, or the same as, those used to form the passivation layer 107 of the first semiconductor structure 100, and details thereof are not repeated herein. In some embodiments, the conductive pad 303 is covered by the passivation layer 307.

Figure 17:
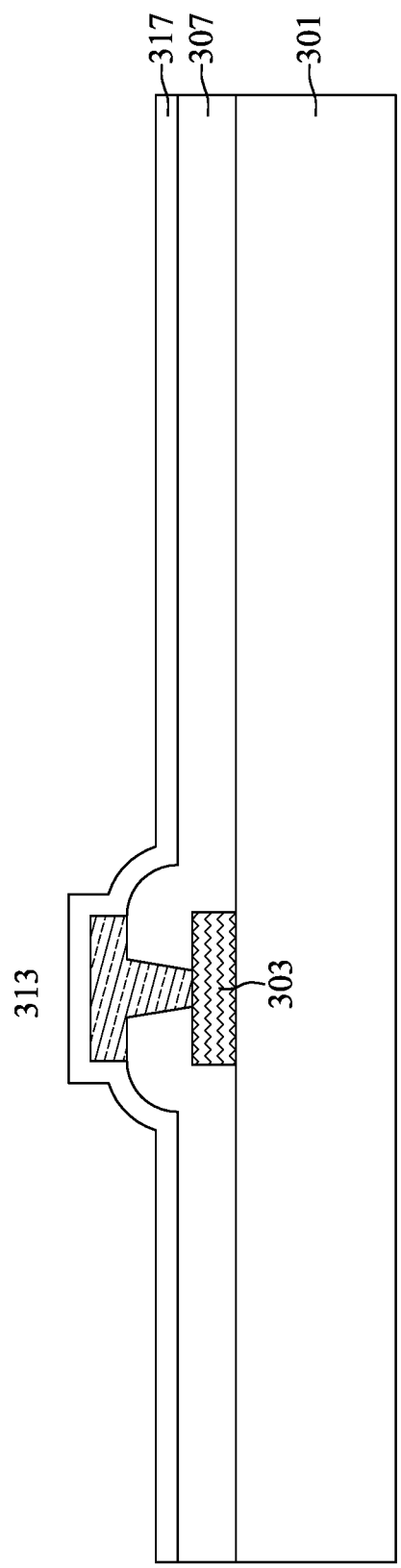
FIG. 17 is a cross-sectional view illustrating an intermediate stage of forming a conductive structure over the second semiconductor substrate during the formation of the modified semiconductor device structure, in accordance with some embodiments.

Next, the conductive structure 313 is formed over the conductive pad 303, and the passivation layer 317 is formed to cover the conductive structure 313, as shown in FIG. 17 in accordance with some embodiments. Some materials and processes used to form the conductive structure 313 and the passivation layer 317 are similar to, or the same as the materials and processes used to form the conductive structure 113B and the passivation layer 107 of the first semiconductor structure 100, and details thereof are not repeated herein. In some embodiments, a lower portion of the conductive structure 313 is surrounded by the passivation layer 307, and an upper portion of the conductive structure 313 extends onto the passivation layer 307. In addition, the passivation layer 307 and the upper portion of the conductive structure 313 are covered by the passivation layer 317.

Figure 18:
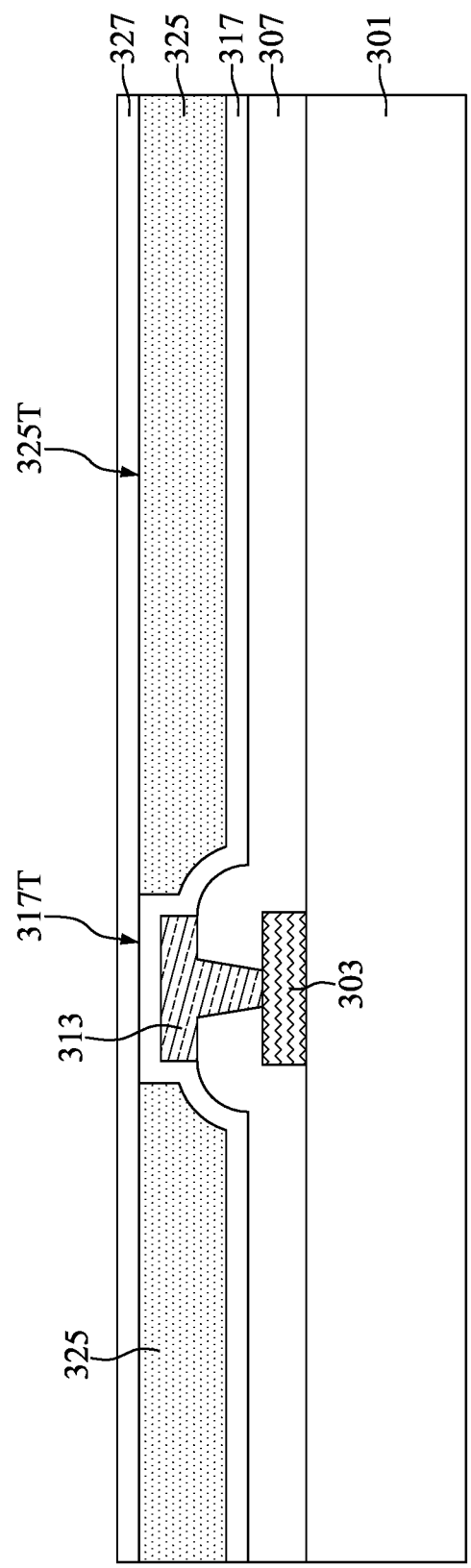
FIG. 18 is a cross-sectional view illustrating an intermediate stage of forming energy removable structures over the second semiconductor substrate during the formation of the modified semiconductor device structure, in accordance with some embodiments.

After the passivation layer 317 is formed, energy removable structures 325 are formed over the passivation layer 317, and the passivation layer 327 is formed to cover the energy removable structures 325, as shown in FIG. 18 in accordance with some embodiments. The respective step is illustrated as the step S37 in the method 10B shown in FIG. 4. Some materials and processes used to form the energy removable structures 325 and the passivation layer 327 are similar to, or the same as the materials and processes used to form the energy removable structures 125 and the passivation layer 107 of the first semiconductor structure 100, and details thereof are not repeated herein.

In some embodiments, the top surfaces 325T of the energy removable structures 325 are substantially level with the top surface 317T of the passivation layer 317 after the planarization process for forming the energy removable structures 325. Although two energy removable structures 325 are shown in the cross-sectional view of FIG. 18, the two energy removable structures 325 may be connected to each other in different cross-sectional views. In addition, the passivation layer 327 is in direct contact with the portion of the passivation layer 317 over the conductive structure 313, and the energy removable structures 325 are enclosed by the passivation layers 317 and 327, in accordance with some embodiments.

Figure 19:
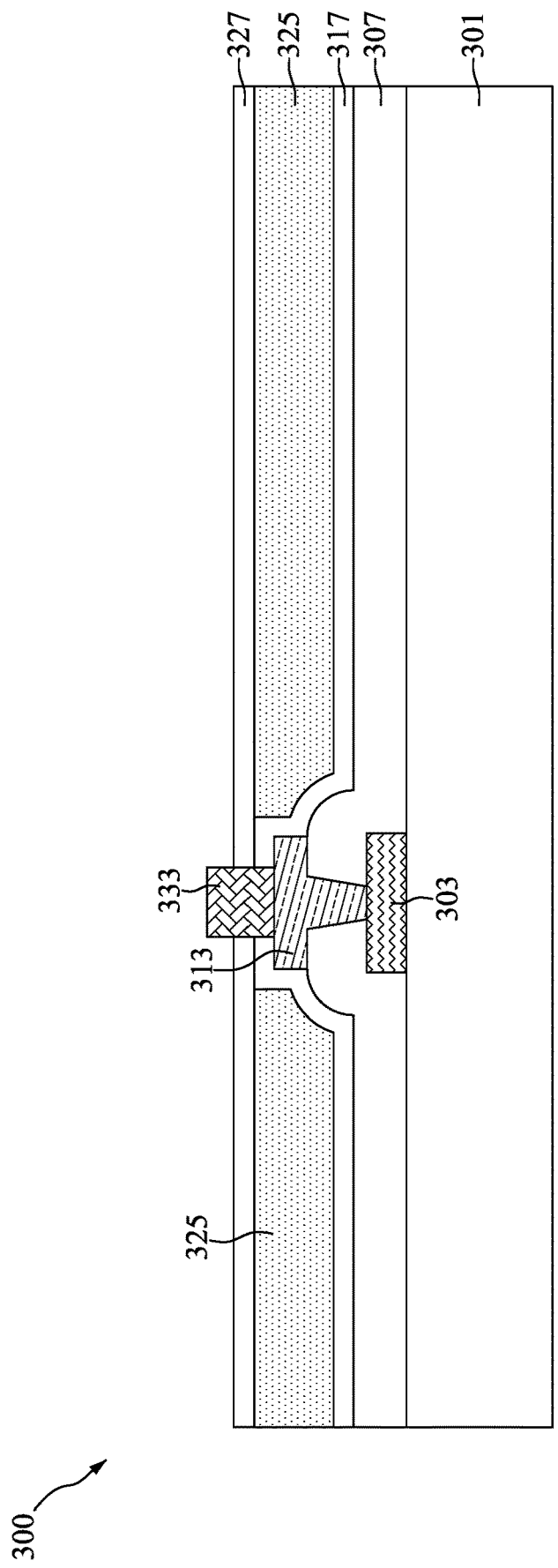
FIG. 19 is a cross-sectional view illustrating an intermediate stage of forming a conductive structure penetrating from a passivation layer over the second semiconductor substrate during the formation of the modified semiconductor device structure, in accordance with some embodiments.

Next, the conductive structure 333 is formed over the conductive structure 313, and the conductive structure 333 protrudes from the passivation layer 327, as shown in FIG. 19 in accordance with some embodiments. The respective step is illustrated as the step S39 in the method 10B shown in FIG. 4. In some embodiments, the conductive structure 333 penetrates through the passivation layers 327 and 317 to contact the conductive structure 313. Some materials and processes used to form the conductive structure 333 are similar to, or the same as the materials and processes used to form the conductive structure 213 of the second semiconductor structure 200, and details thereof are not repeated herein. After the conductive structure 333 is formed, the second semiconductor structure 300 is obtained.

Figure 20:
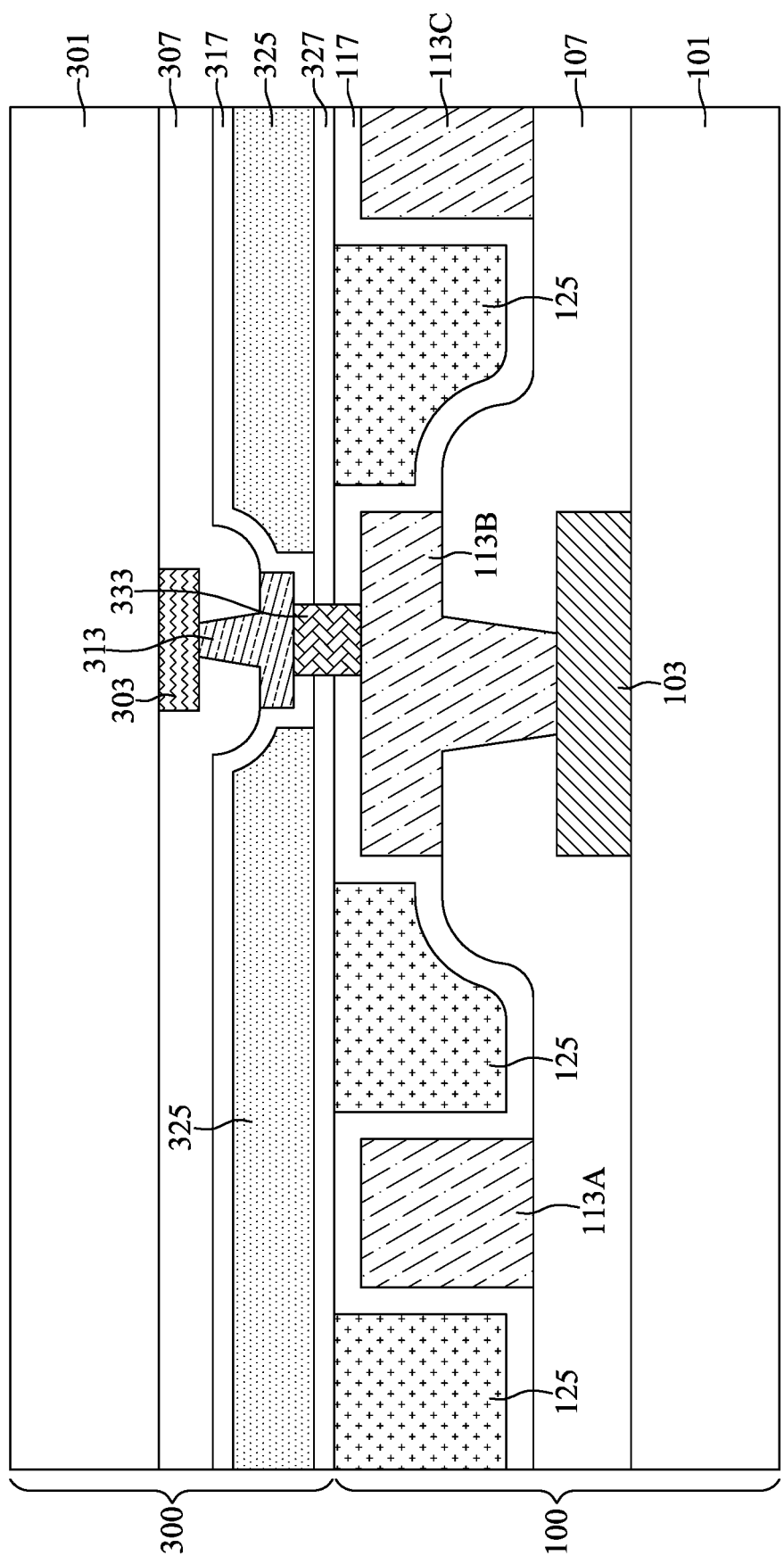
FIG. 20 is a cross-sectional view illustrating an intermediate stage of bonding the first semiconductor substrate to the second semiconductor substrate during the formation of the modified semiconductor device structure, in accordance with some embodiments.

Subsequently, the second semiconductor structure 300 is flipped upside down and bonded to the first semiconductor structure 100 with the passivation layer 327 facing the passivation layer 117, as shown in FIG. 20 in accordance with some embodiments. The respective step is illustrated as the step S41 in the method 10B shown in FIG. 4. After the bonding process, the energy removable structures 125 are enclosed by the passivation layers 117 and 327.

Referring back to FIG. 2, a heat treatment process is performed on the structure of FIG. 20 to transform the energy removable structures 125 into the air gaps 510, and to transform the energy removable structures 325 into the air gaps 520. The respective step is illustrated as the step S43 in the method 10B shown in FIG. 4. In some embodiments, during the heat treatment process, the energy removable structures 125 and 325 are removed, such that the air gaps 510 and 520 are formed, and the semiconductor device structure 500B is obtained.

The heat treatment process performed on the structure of FIG. 20 is similar to, or the same as the heat treatment process performed on the structure of FIG. 15, and details thereof are not repeated herein. In some embodiments, the air gaps 520 are located over the air gaps 510. It should be noted that each of the portions of the passivation layer 327 sandwiched between the air gaps 520 and the air gaps 510 has a curved shape due to gravity. In some embodiments, the curved shape is concave upward.

Embodiments of the semiconductor device structures 500A and 500B are provided in the disclosure. The semiconductor device structure 500A includes the conductive structures 113B and 213 between the first semiconductor substrate 101 and the second semiconductor substrate 201. The semiconductor device structure 500A also includes the passivation layer 117 covering the conductive structure 113B, and the passivation layer 207 over the passivation layer 117. The air gaps 510 are enclosed by the passivation layers 117 and 207. The semiconductor device structure 500B includes the conductive structures 113B and 333 between the first semiconductor substrate 101 and the second semiconductor substrate 301. The semiconductor device structure 500B also includes the passivation layer 117 covering the conductive structure 113B, the passivation layer 327 over the passivation layer 117, and the passivation layer 317 over the passivation layer 327. The air gaps 510 are enclosed by the passivation layers 117 and 327, and air gaps 520 are enclosed by the passivation layers 327 and 317. By forming air gaps 510 (and 520) between adjacent conductive structures, the parasitic capacitance between the adjacent conductive structures may be reduced. As a result, the overall device performance may be improved (i.e., the decreased power consumption and RC delay).

In one embodiment of the present disclosure, a semiconductor device structure is provided. The semiconductor device structure includes a first conductive pad over a first semiconductor substrate, and a first conductive structure over the first conductive pad. The semiconductor device structure also includes a second conductive structure over the first conductive structure, and a second conductive pad over the second conductive structure. The second conductive pad is electrically connected to the first conductive pad through the first conductive structure and the second conductive structure. The semiconductor device structure further includes a second semiconductor substrate over the second conductive pad, and a first passivation layer between the first semiconductor substrate and the second semiconductor substrate and covering the first conductive structure. In addition, the semiconductor device structure includes a second passivation layer between the first passivation layer and the second semiconductor substrate. The first passivation layer and the second passivation layer surround the second conductive structure, and a first air gap is enclosed by the first passivation layer and the second passivation layer.

In another embodiment of the present disclosure, a semiconductor device structure is provided. The semiconductor device structure includes a first conductive pad over a first semiconductor substrate, and a first conductive structure over the first conductive pad. The semiconductor device structure also includes a first passivation layer covering the first conductive structure, and a second passivation layer covering the first passivation layer. A first air gap is enclosed by the first passivation layer and the second passivation layer, and a bottom surface of the first air gap is lower than a top surface of the first conductive structure. The semiconductor device structure further includes a second conductive structure penetrating through the first passivation layer and the second passivation layer to contact the first conductive structure, and a second conductive pad over the second conductive structure. The second conductive pad is electrically connected to the first conductive pad through the first conductive structure and the second conductive structure. In addition, the semiconductor device structure includes a second semiconductor substrate over the second conductive pad.

In yet another embodiment of the present disclosure, a method for forming a semiconductor device structure is provided. The method includes forming a first semiconductor structure, and forming a second semiconductor structure. The method for forming the first semiconductor structure includes forming a first passivation layer to cover a first conductive structure over a first semiconductor substrate, and forming a first energy removable structure over the first passivation layer. The method for forming the second semiconductor structure includes forming a second conductive structure and a second passivation layer over a second semiconductor substrate. The second conductive structure protrudes from the second passivation layer. The method also includes bonding the second semiconductor structure to the first semiconductor structure with the second passivation layer facing the first passivation layer, and performing a heat treatment process to transform the first energy removable structure into a first air gap enclosed by the first passivation layer and the second passivation layer.

The embodiments of the present disclosure have some advantageous features. By forming air gaps enclosed by passivation layers, the parasitic capacitance between the conductive features (i.e., interconnect structures) in the passivation layers can be reduced to significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
a first conductive pad over a first semiconductor substrate;
a first conductive structure over the first conductive pad;
a second conductive structure over the first conductive structure;
a second conductive pad over the second conductive structure, wherein the second conductive pad is electrically connected to the first conductive pad through the first conductive structure and the second conductive structure;
a second semiconductor substrate over the second conductive pad;
a first passivation layer between the first semiconductor substrate and the second semiconductor substrate and covering the first conductive structure; and
a second passivation layer between the first passivation layer and the second semiconductor substrate, wherein the first passivation layer and the second passivation layer surround the second conductive structure, and a first air gap is enclosed by the first passivation layer and the second passivation layer;
wherein the first passivation layer covers a top surface and a sidewall of the first conductive structure.

2. The semiconductor device structure of claim 1, further comprising:
a third conductive structure adjacent to the first conductive structure, wherein the first air gap is between the first conductive structure and the third conductive structure.

3. The semiconductor device structure of claim 2, wherein the first passivation layer covers a top surface and a sidewall of the third conductive structure.

4. The semiconductor device structure of claim 1, further comprising:
a third passivation layer between the first passivation layer and the first semiconductor substrate, wherein the third passivation layer covers the first conductive pad and surrounds a lower portion of the first conductive structure.

5. The semiconductor device of claim 1, further comprising:
a fourth passivation layer between the second passivation layer and the second semiconductor substrate, wherein the second conductive structure is surrounded by the first passivation layer, the second passivation layer, and the fourth passivation layer, and a second air gap is enclosed by the second passivation layer and the fourth passivation layer.

6. The semiconductor device structure of claim 1, wherein the first air gap has a concave top surface.

7. A semiconductor device structure, comprising:
a first conductive pad over a first semiconductor substrate;
a first conductive structure over the first conductive pad;
a first passivation layer covering the first conductive structure;
a second passivation layer covering the first passivation layer, wherein a first air gap is enclosed by the first passivation layer and the second passivation layer, and a bottom surface of the first air gap is lower than a top surface of the first conductive structure;
a second conductive structure penetrating through the first passivation layer and the second passivation layer to contact the first conductive structure;
a second conductive pad over the second conductive structure, wherein the second conductive pad is electrically connected to the first conductive pad through the first conductive structure and the second conductive structure; and
a second semiconductor substrate over the second conductive pad.

8. The semiconductor device structure of claim 7, further comprising:
a third conductive structure adjacent to the first conductive structure, wherein the first passivation layer covers a sidewall of the first conductive structure and a sidewall of the third conductive structure such that the third conductive structure is separated from the first conductive structure by the first passivation layer and the first air gap.

9. The semiconductor device structure of claim 7, further comprising:
a third passivation layer between the first semiconductor substrate and the first passivation layer, wherein the third passivation layer covers the first conductive pad, and the first conductive structure penetrates through the third passivation layer to contact the first conductive pad.

10. The semiconductor device structure of claim 9, wherein the first conductive structure extends onto the third passivation layer.

11. The semiconductor device structure of claim 9, wherein a topmost surface of the third passivation layer is higher than the bottom surface of the first air gap.

12. The semiconductor device structure of claim 7, further comprising:
a fourth passivation layer between the second passivation layer and the second semiconductor substrate, wherein the second conductive structure penetrates through the fourth passivation layer, and a second air gap is enclosed by the second passivation layer and the fourth passivation layer, and wherein a portion of the second passivation layer between the first air gap and the second air gap has a curved shape.

13. A method for forming a semiconductor device structure, comprising:
forming a first semiconductor structure, comprising:
forming a first passivation layer to cover a first conductive structure over a first semiconductor substrate; and
forming a first energy removable structure over the first passivation layer; and
forming a second semiconductor structure, comprising:
forming a second conductive structure and a second passivation layer over a second semiconductor substrate, wherein the second conductive structure protrudes from the second passivation layer; and
bonding the second semiconductor structure to the first semiconductor structure with the second passivation layer facing the first passivation layer; and
performing a heat treatment process to transform the first energy removable structure into a first air gap enclosed by the first passivation layer and the second passivation layer.

14. The method for forming a semiconductor device structure of claim 13, wherein a top surface of the first energy removable structure is substantially level with a top surface of the first passivation layer before bonding the second semiconductor structure to the first semiconductor structure.

15. The method for forming a semiconductor device structure of claim 13, wherein forming the first semiconductor structure further comprises:
forming a third passivation layer covering a first conductive pad over the first semiconductor substrate;
etching the third passivation layer to form an opening exposing the first conductive pad; and forming the first conductive structure and a third conductive structure over the third passivation layer, wherein the opening is filled by the first conductive structure.

16. The method for forming a semiconductor device structure of claim 15, wherein the first passivation layer is formed to cover a sidewall of the first conductive structure and a sidewall of the third conductive structure, and the first conductive structure is separated from the third conductive structure by the first passivation layer and the first energy removable structure.

17. The method for forming a semiconductor device structure of claim 13, wherein forming the first semiconductor structure further comprises etching the first passivation layer to expose a top surface of the first conductive structure, and
wherein the second conductive structure is bonded to the top surface of the first conductive structure after the second semiconductor structure is bonded to the first semiconductor structure.

18. The method for forming a semiconductor device structure of claim 13, wherein forming the second semiconductor structure comprises:
forming a fourth passivation layer covering a second conductive pad over the second semiconductor substrate; and
forming a second energy removable structure over the fourth passivation layer before the second conductive structure and the second passivation layer are formed.

19. The method for forming a semiconductor device structure of claim 18, wherein the second energy removable structure is enclosed by the fourth passivation layer and the second passivation layer before the second semiconductor structure is bonded to the first semiconductor structure, and
wherein the second energy removable structure is transformed into a second air gap during the heat treatment process, and the second air gap has a concave bottom surface.

* * * * *